United States Patent [19]

Koga et al.

[11] Patent Number: 5,055,801
[45] Date of Patent: Oct. 8, 1991

[54] DIGITAL PHASE LOCKED LOOP FOR CORRECTING A PHASE OF AN OUTPUT SIGNAL WITH RESPECT TO AN INPUT SIGNAL

[75] Inventors: Fumiaki Koga, Neyagawa; Tokikazu Matsumoto, Osaka, both of Japan

[73] Assignee: Matsushita Electric Industrial Co., Ltd., Osaka, Japan

[21] Appl. No.: 464,002

[22] Filed: Jan. 12, 1990

[30] Foreign Application Priority Data

Jan. 12, 1989 [JP] Japan .................................. 1-5209

[51] Int. Cl.⁵ .................................. H03L 7/093
[52] U.S. Cl. .................................. 331/14; 331/17; 331/25; 328/14; 328/155
[58] Field of Search ............... 331/14, 17, 25; 328/14, 328/155

[56] References Cited

U.S. PATENT DOCUMENTS 4,135,166  1/1979  Marchetti ............................. 331/14
4,942,371  7/1990  Kashiwaba et al. ................... 331/14

FOREIGN PATENT DOCUMENTS

0239412A2   9/1987  European Pat. Off. .
0247891A2  12/1987  European Pat. Off. .
60-072495   4/1985  Japan .
63-237678  10/1988  Japan .
63-296589  12/1988  Japan .
518031      2/1972  Switzerland .

Primary Examiner—Siegfried H. Grimm
Attorney, Agent, or Firm—Wenderoth, Lind & Ponack

[57] ABSTRACT

A digital phase locked loop for correcting the phase of an output signal with respect to an input signal has a phase comparator for comparing the phases of the input signal and a feedback signal from a variable frequency oscillator. The output signal of the phase comparator representing the phase difference is integrated in a low pass filter. The output of the low pass filter is supplied to a switch which alternately selects between the output of the low pass filter and a zero level signal from a zero generator. The output of the switch is supplied to the variable frequency oscillator. The output signal of the variable frequency oscillator is returned to the phase comparator, so that the phase of the output signal from the variable frequency oscillator is synchronized with the phase of the input signal.

20 Claims, 10 Drawing Sheets

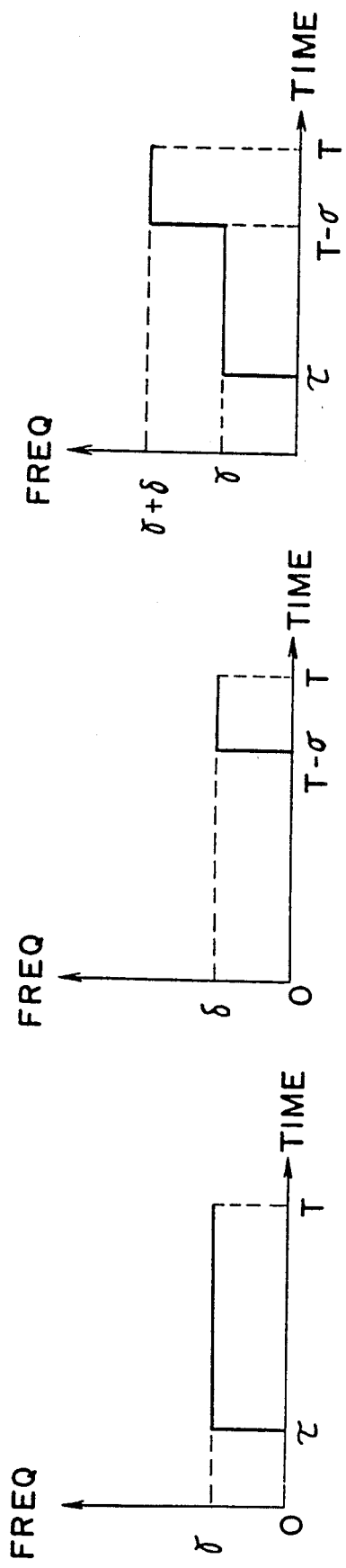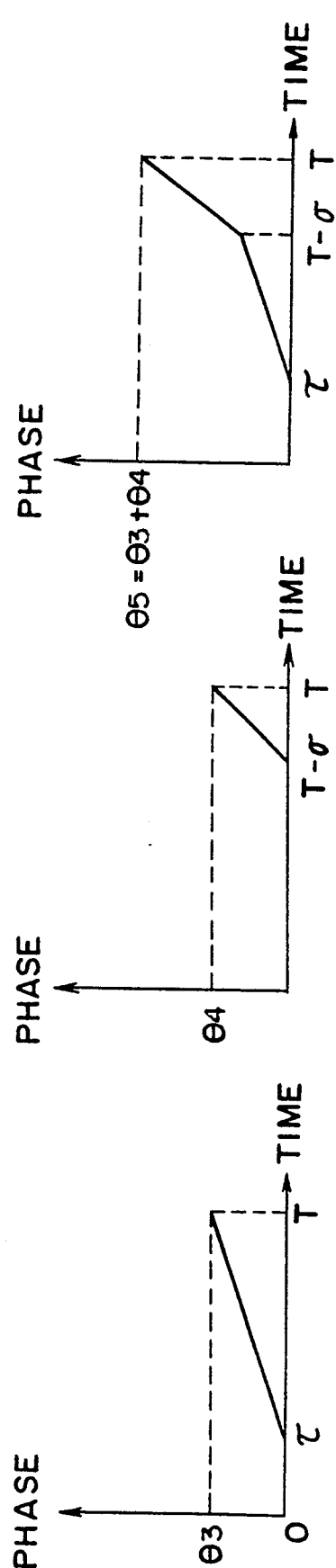

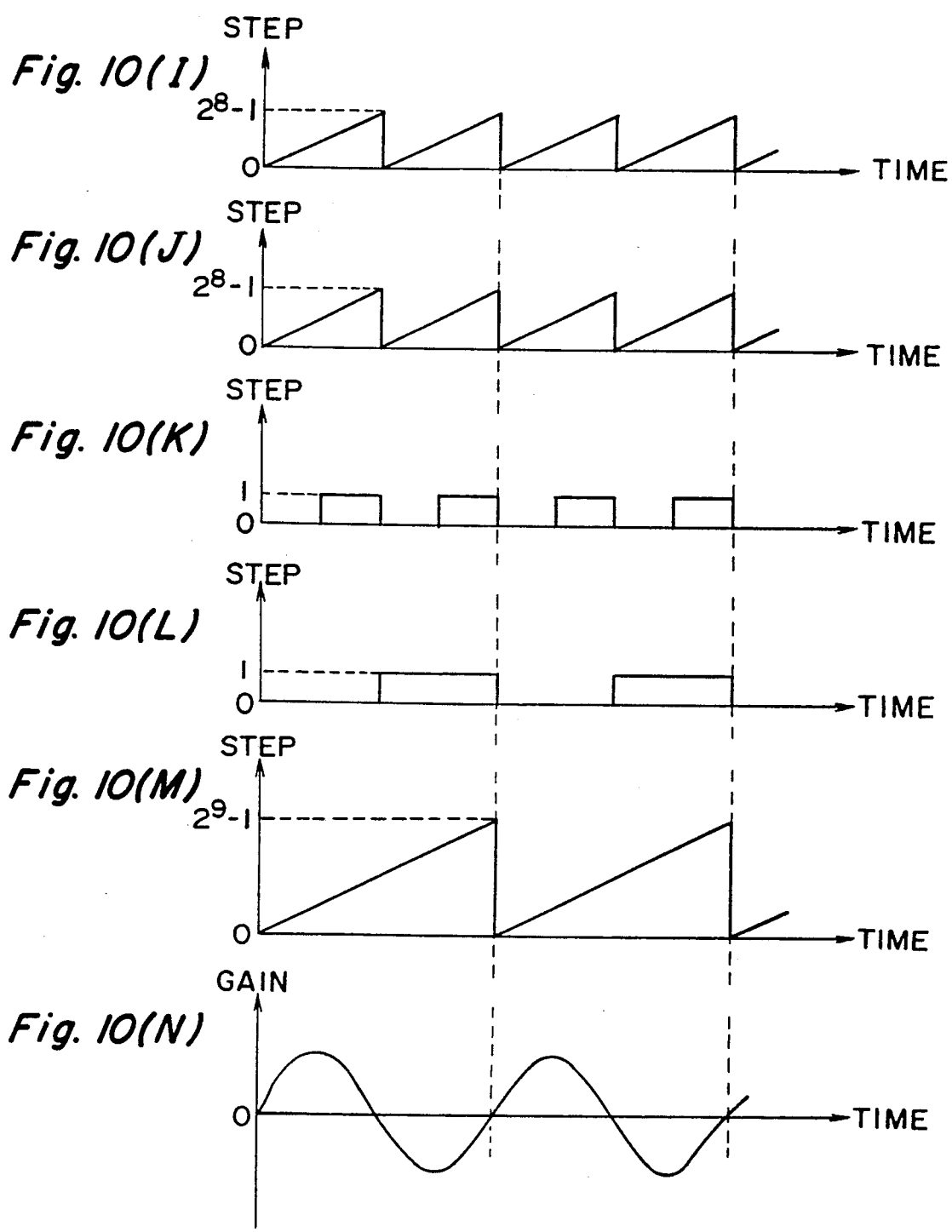

DIGITAL PHASE LOCKED LOOP FOR CORRECTING A PHASE OF AN OUTPUT SIGNAL WITH RESPECT TO AN INPUT SIGNAL

BACKGROUND OF THE INVENTION

1. Field of the Invention

The present invention relates to a digital phase locked loop which can effect phase synchronization of an output signal with respect to an input signal.

2. Description of the Prior Art

Conventionally, a digital phase locked loop including a phase comparator, a low pass filter (hereinafter referred to as an LPF), and a voltage controlled oscillator (hereinafter referred to as a VCO) has been used for phase synchronization of a desired digital signal. The operation of this type of digital phase locked loop is described below.

The phase of the input signal to the phase comparator and the phase of the output signal of the VCO are compared, and the phase difference between the input signal and the VCO output signal is output from the phase comparator. This phase difference is integrated by the LPF, and a signal which oscillates at a frequency corresponding to this phase difference is obtained from the VCO and returned to the phase comparator. If the phase of the input signal has not changed, the output of the phase comparator is converged to a predetermined value after a certain period of time determined by the response characteristics, and a signal the whose phase is synchronized to the input signal is obtained as the output of the VCO. Of course, if the phase of the input signal changes, the phase of the output signal tracks the phase change. Such a digital phase locked loop is disclosed, for example, in Japanese Laid-Open Patent Publication No. 63-237678.

However, when this operation is actually executed by a hardware embodiment of the digital phase locked loop, the signal is delayed by the phase comparator, LPF, and VCO, and a phase error which is the sum of the delay in each circuit of the loop (in-loop delay) occurs, and the response of the digital phase locked loop deteriorates, specifically the time required to synchronize the phase of the input and output signals of the digital phase locked loop increases.

SUMMARY OF THE INVENTION

The present invention has been developed with a view to substantially solving the above described disadvantages and has for its essential object to provide an improved digital phase locked loop which eliminates the phase error caused by in-loop delays and thus offers good response characteristics.

In accomplishing these and other objects, a digital phase locked loop, according to the present invention comprises: a variable frequency oscillator; a phase comparator for comparing the phase of a signal applied thereto with the phase of the output signal from the variable frequency oscillator after every predetermined period of time; an integrator for integrating the output of the phase comparator; a first coefficient circuit which amplifies the integrator output by a rate determined by the first coefficient; a second coefficient circuit which amplifies the phase comparator output by a rate determined by the second coefficient; an adder for adding the output of the first coefficient circuit and the output of the second coefficient circuit, and a switch for switching between the output of the adder and a constant value, whereby the variable frequency oscillator oscillates at a frequency proportional to the output of the switch.

According to the digital phase locked loop of the present invention, phase errors are eliminated and response characteristics are improved by switching between the output of the adder and a specified value, zero (0) in the present embodiment, i.e., the value which is equal to the input to the variable frequency oscillator when the variable frequency oscillator oscillates at a center frequency, and by setting the coefficient of the first and second coefficient circuits at an appropriate value to compensate for the in-loop delay.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals, and in which:

FIGS. 5(a), 5(c), and 5(e) are graphs showing the relationship between time and frequency at points A, B, and C, respectively, in FIG. 2;

FIG. 5(f) is a graph showing the relationship between time and phase at point D in FIG. 2;

FIGS. 5(b) and 5(d) are curves showing the relationship between time and phase at point D in FIG. 2 when only the signal at point A and B, respectively, in FIG. 2 is integrated by the VCO;

FIGS. 10(I)–10(M) show waveforms illustrating the relationship between time and the step of the respective signals I–M shown in FIG. 9 and FIG. 10(N) shows a waveform illustrating the relationship between time and the gain of signal N shown in FIG. 9;

DETAILED DESCRIPTION OF THE PREFERRED EMBODIMENTS

A first embodiment of a digital phase locked loop is described herein below with reference to the accompanying drawings.

Figure 1:
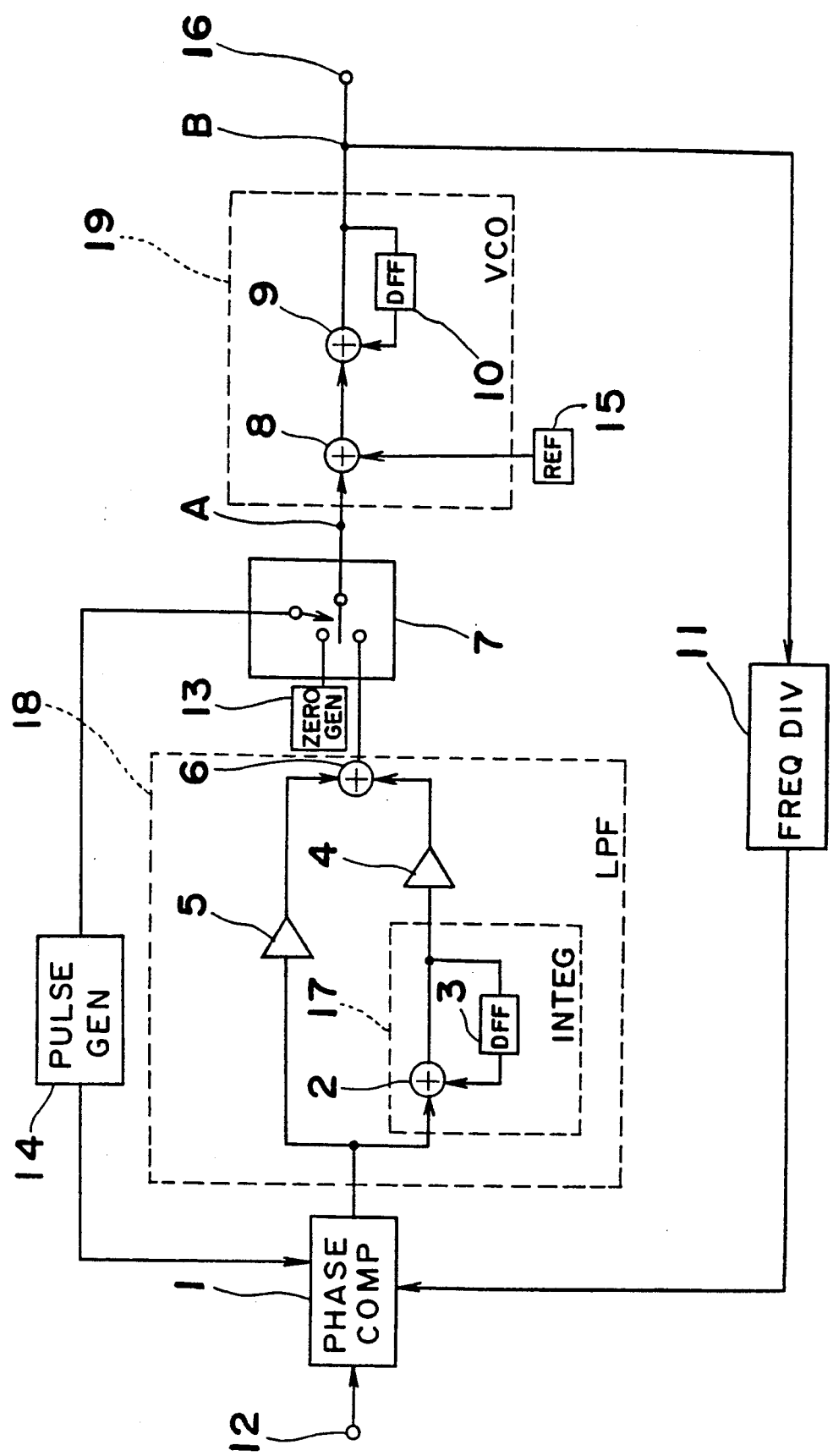
FIG. 1 is a block diagram of a digital phase locked loop according to a first embodiment of the present invention.

FIG. 1 shows a diagrammatic view of a digital phase locked loop according to a first embodiment of the present invention.

In FIG. 1, element 1 is a phase comparator which is operated by a pulse generated from a pulse generator 14 and compares the phase of the signal input to the input terminal 12 of the phase comparator with the phase of the output signal from a VCO (a variable frequency oscillator) 19 after having been divided by the frequency divider 11; element 2 is an adder which adds the output of the phase comparator 1 with the output of a D flip-flop (DFF) 3; element 17 is an integrator comprised of the adder 2 and the DFF 3; element 4 is a first coefficient circuit which amplifies the output of integrator 17; element 5 is a second coefficient circuit which amplifies the output of phase comparator 1; element 6 is an adder which adds the outputs of first coefficient circuit 4 and second coefficient circuit 5; element 18 is an LPF comprised of integrator 17, first coefficient circuit 4, and second coefficient circuit 5; element 7 is a switch which is operated by a pulse supplied from pulse generator 14 and is switched between the output of adder 6 and an output of a predetermined level generator 13 for providing a predetermined level, such as "0" in the preferred embodiment; element 8 is an adder which adds the output of switch 7 and a predetermined reference value supplied from a reference input terminal 15; element 9 is an adder which adds the output of adder 8 and the output of a DFF 10; element 19 is a VCO comprised of adder 8, adder 9, and DFF 10; element 16 is an output terminal of the VCO 19; and element 11 is a frequency divider which frequency divides the output of VCO 19.

The operation of the digital phase locked loop of FIG. 1 is described herein below with reference to the accompanying drawing figures.

Described below is the operation of the circuit of FIG. 1 when a sine wave used as a phase reference signal (input signal) is input to terminal 12.

Figure 6:
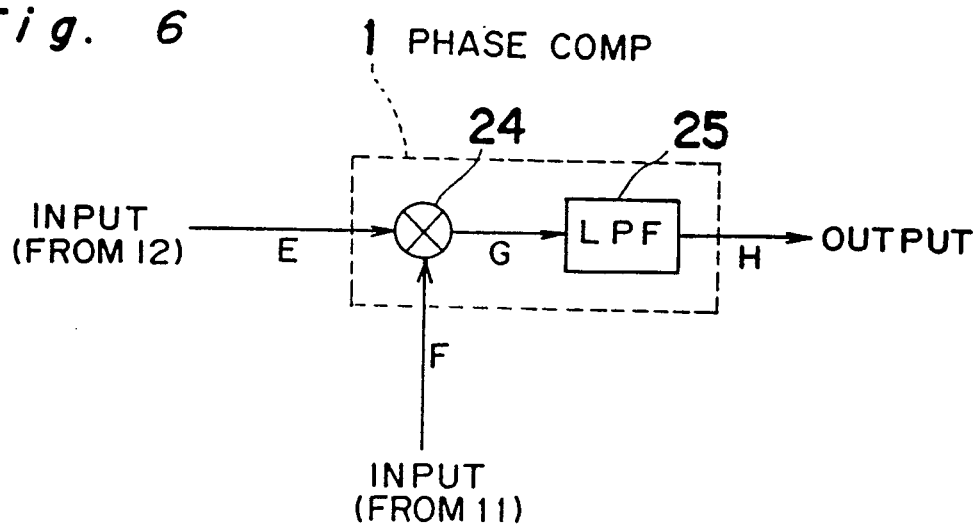
FIG. 6 is a block diagram of the phase comparator employed in the digital phase locked loop shown in FIG. 1.

It is to be noted that the phase comparator 1 is comprised, for example, of a multiplier 24 and an LPF 25 as shown in FIG. 6.

Figure 7E:
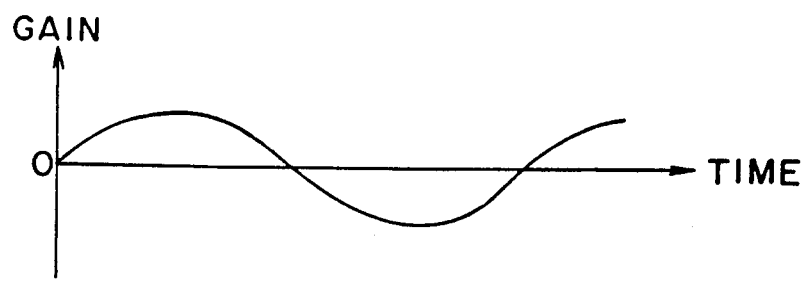
FIGS. 7(E)–7(H) show waveforms illustrating the relationship between time and gain of the respective signals E–H shown in FIG. 6.
Figure 7F:
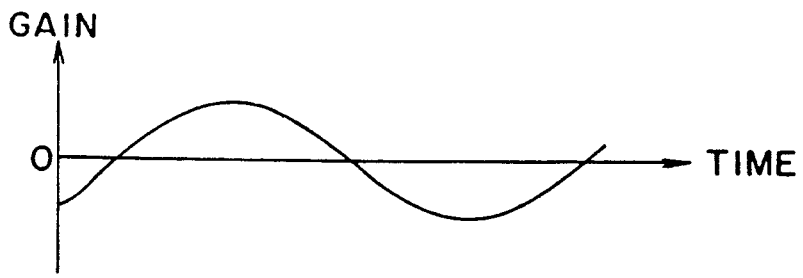
Figure 7G:
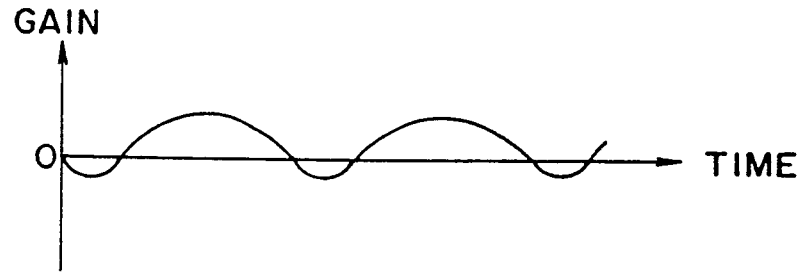
Figure 7H:
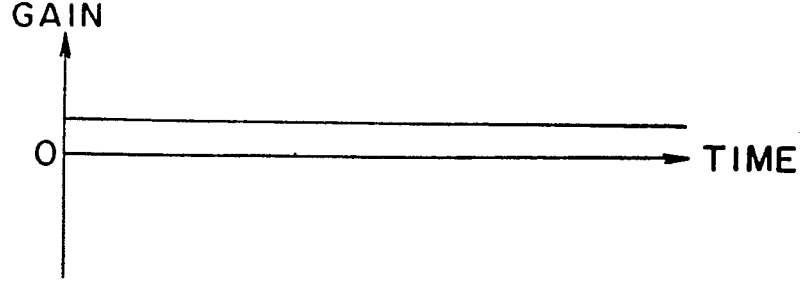

The waveforms of the two inputs are compared in phase by the phase comparator 1. The two input signals E and F input to the multiplier 24, are shown in FIG. 7(E) and 7(F). The signal G, which is the result of multiplication of signals E and F multiplied by the multiplier 24, is shown in FIG. 7(G). The waveform of signal H which is the integrated result of signal G by LPF 25 is shown in FIG. 7(H). The signal H is the phase compared signal of signals E and F.

This signal H (the output of the phase comparator 1) and the output of the DFF 3, are added by adder 2, and the added result is input to the first coefficient circuit 4. The circuit comprised of the adder 2 and the DFF 3 is the integrator 17, and the circuit comprised of this integrator 17 and the first coefficient circuit 4 determines the characteristics of the integration factor of the transfer function of LPF 18. In addition, the output of the phase comparator 1 is also input to the second coefficient circuit 5, and the second coefficient circuit 5 determines the proportion component of the transfer function of the LPF 18. The first coefficient circuit 4 and the second coefficient circuit 5 include, for example, a multiplier or alternatively a ROM (read-only memory) device.

When a ROM is employed, the ROM table may be written so that the address signal may be input and a amplified signal should be outputted from the ROM.

The output of the first coefficient circuit 4 and the second coefficient circuit 5 is added by adder 6 and the added result is input to one of the terminals of the switch 7. The other terminal of switch 7 is supplied with a predetermined value, such as a zero value, from a zero value generator 13. This 0 (zero) value is the same value as the input value to the VCO 19 when the VCO 19 oscillates at the center frequency determined by the reference value input to the reference input terminal 15. For example, when the output signal of the switch 7 is an 8-bit digital signal expressing a $-128$ to 127 step offset binary, the 0 value from the zero value generator 13 represents a 0 step.

The operation of switch 7 is controlled by control pulses produced from pulse generator 14, so that switch 7 is switched between adder 6 and zero value generator 13 at a frequency which is the same as the frequency for controlling the phase comparator 1. The operation of the switch 7 according to this pulse is described in detail below. The output of the switch 7 and the reference value provided from reference generator 15 are added by the adder 8, and the output from the adder 8 is further added to the output of the DFF 10 by adder 9.

Figure 8:
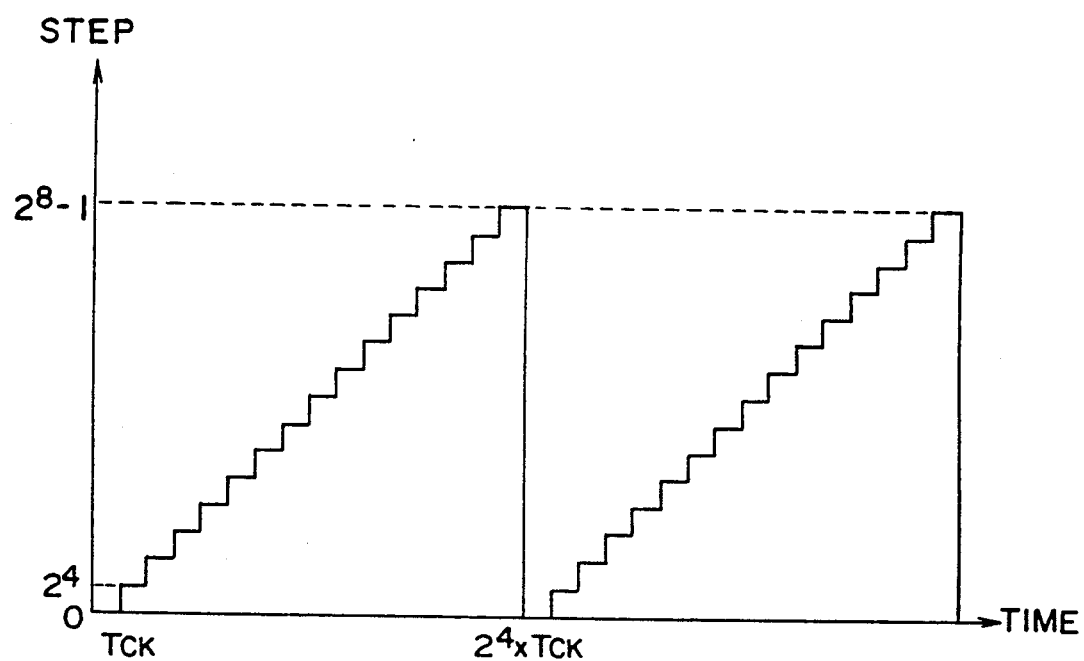
FIG. 8 is a waveform showing the relationship between time and the step of signal B shown in FIG. 1.

At this point, the following conditions are considered such that: the output from the switch 7 is at step 0 5 (for example, by the switching operation to zero generator 13); the reference value supplied from reference generator 15 is $2^4$ ($=$step 16); one cycle period of pulses input to the DFF 10 is Tck; and the number of bits added by the adder 9 is 8 bits. Then the output of the adder 9, i.e., the signal at point B, is a sawtooth wave as shown in FIG. 8. The signal during point B is increased by $2^4$ (16 steps) at each cycle period Tck. If the initial value at point B is 0, VCO 19 overflows after time $Tck \times 2^8 / 2^4 = 16\ Tck$, so that point B becomes 0 again. In other words, the oscillation frequency of the VCO 19 is 1/16 Tck. Thus, the center frequency of the sawtooth wave which is the output of the adder 9 is determined by the reference value input from the reference generator 15, and the oscillation frequency is determined by the output of the LPF 18.

Figure 9:
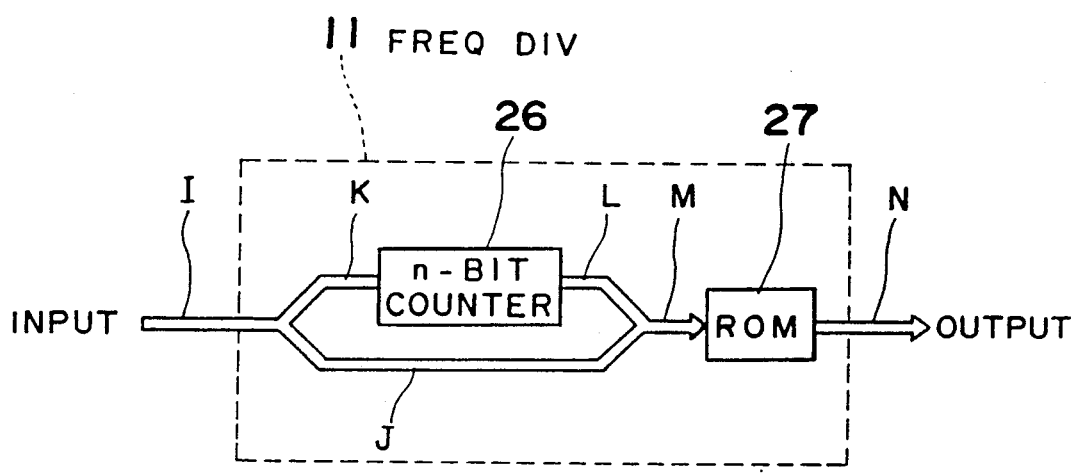
FIG. 9 is a block diagram of the frequency divider employed in the digital phase locked loop shown in FIG. 1.

The output B of the VCO 19 is input to the frequency divider 11. As shown, for example, in FIG. 9, the frequency divider 11 is comprised of an n-bit counter 26 and ROM 27. If the number of bits counted by the n-bit counter 26 (n is a natural number) is 1 bit (n=1), signals I, J, K, L, M and N shown in FIG. 9 will have the waveforms shown in FIGS. 10(I), 10(J), 10(K), 10(L), 10(M) and 10(N) respectively. Signal I in FIG. 9 has a sawtooth waveform as shown in FIG. 10(I), and is identical to the sawtooth waveform shown in FIG. 8. Only the most significant bit (MSB) of the signal I is input to the n-bit counter 26 and counted as shown by in FIG. 10(K). Since the number of bits counted by counter 26 is one, signal L will have a waveform as shown in FIG. 10(L). To maintain the precision of the input signal even in the output signal, a combined 9-bit signal M is formed such that signal L is used as the MSB and signal J shown by FIG. 10(J) is used as the lower 8-bit component of the 9-bit signal M, resulting in the sawtooth waveform shown in FIG. 10(M). Signal M is thus the ½ frequency divided product of signal I. The number of frequency divisions depends, of course, on the bit number of the n-bit counter 26, and it is therefore possible to set the frequency division ratio as desired by setting the bit number at any value other than the one bit used in the above example. The ROM table of the ROM 27 is written so that when this signal M is input to the address of ROM 27, the data is output as a sine wave as shown in FIG. 10(N). The output of this ROM 27, i.e., the output of the frequency divider 11, is returned to the phase comparator 1, and compared as described above with the phase reference signal.

Next, the operation when a horizontal sync signal in a standard television signal is supplied to the input 12 as the phase reference signal (input signal) is described below.

Figure 11A:
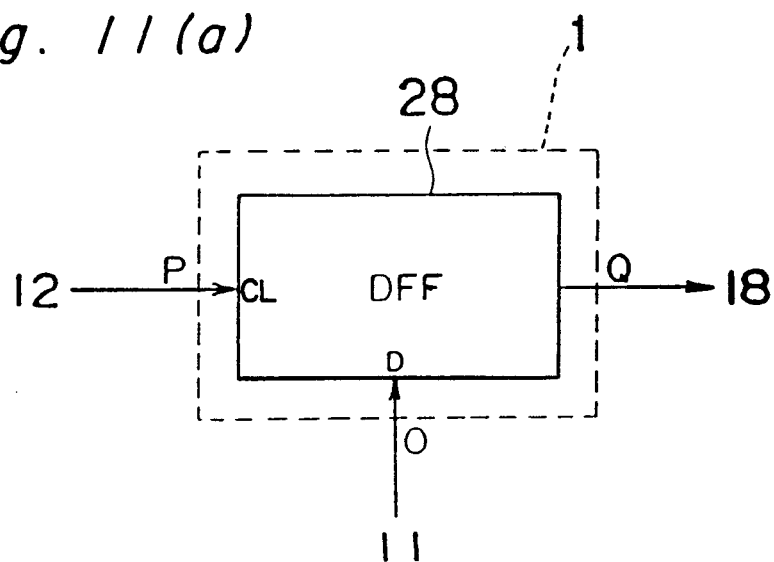
FIG. 11(a) shows a block diagram of the phase comparator which is a modification of the phase comparator shown in FIG. 6.

In this example, the phase comparator 1 may be simply comprised of a D flip-flop 28, as shown in FIG. 11(a). At this time, the ROM 27 in frequency divider 11 can be deleted. Thus, the output of the frequency divider 11 is the sawtooth wave signal M and not the signal N. The sawtooth wave signal M from frequency divider 11 is supplied to a data input of the DFF 28 in the phase comparator 1. Furthermore, the DFF in phase comparator 1 has a clock input to which the horizontal sync signal is applied. Thus, the data (sawtooth wave signal M) is latched at the rise edge of the input (horizontal sync signal). The data input, clock input, and data output have waveforms as shown in FIGS. 11(b)(O), 11(b)(P), and 11(b)(Q).

Figure 11B:
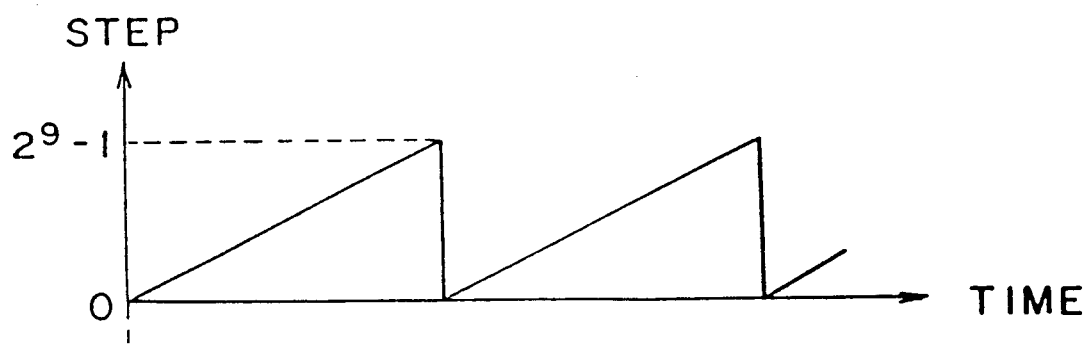
FIG. 11(b)(O), 11(b)(P) and 11(b)(Q) shows waveforms illustrating the relationship between time and the step of the data input, clock input, and data output, respectively, in the phase comparator of FIG. 11(a)
Figure 11B:
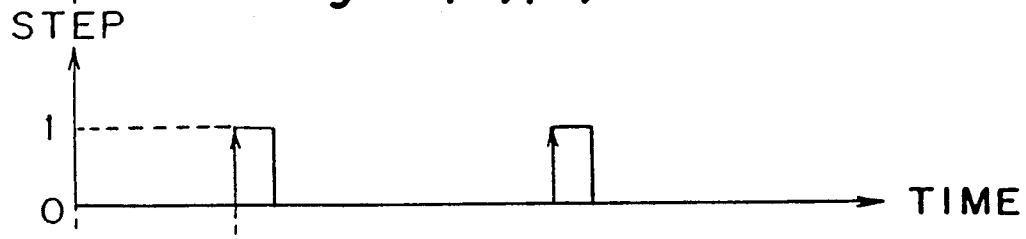
Figure 11B:
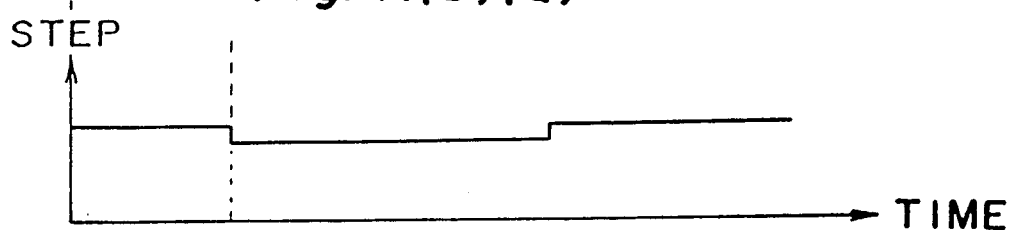

As understood from FIGS. 11(a) and 11(b)(O)–11(b)(Q) the phase difference between the horizontal sync signal applied to clock input of the DFF 28 in phase comparator 1 and the output of the frequency divider 11 supplied to the data input can be obtained by latching the output of the frequency divider 11 at the pulse edge of the horizontal sync signal (phase reference signal).

Thus, depending on the type of the phase reference signal, various circuit arrangements may be used for the phase comparator 1 and frequency divider 11.

It is to be noted that according to the embodiment shown in FIG. 11(a), the pulse generator 14 is a horizontal sync pulse generator so that the same horizontal sync pulse is supplied to switch 7 as a control pulse for effecting the switching operation and, at the same time, to input 12 as phase reference signal. In other words, one cycle period T of the horizontal sync pulse for effecting the phase comparison by the phase comparator 1 should be the same as time period of cyclic operation to synchronize the phase of the phase reference signal (input signal) input to input terminal 12 with the phase of the output signal from output terminal 16.

As has been described above, when the phase reference signal applied to input 12 is a sine wave (for example, the color subcarrier signal in a standard television signal, or more specifically the color burst signal), the control pulse input to switch 7 is derived from the horizontal sync signal in the standard television signal. If the phase reference signal is the horizontal sync signal as previously described, the control pulse input to switch 7 is generated from the horizontal sync signal. Thus, in both cases, the pulse generator 14 generates a horizontal sync signal. Thus, the control pulse input to switch 7 can be generated by various means.

Furthermore, because the phase of the phase reference signal supplied to input 12 and the phase of the output signal as produced from output 16 are finally synchronized, the synchronized pulse can be generated not only from output 16, but also from the output of the frequency divider 11.

Next, the operation for correcting the in-loop delay is described.

Figure 4A:
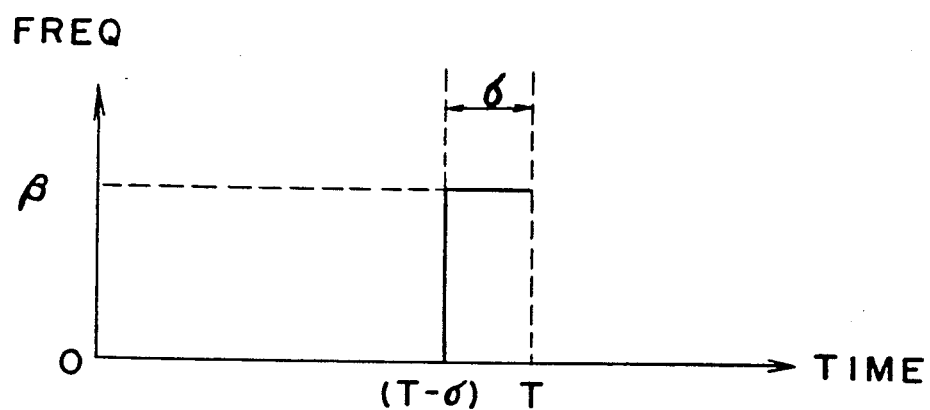
FIG. 4(a) is a graph showing the relationship between time and frequency at point A in FIG. 1.
Figure 4B:
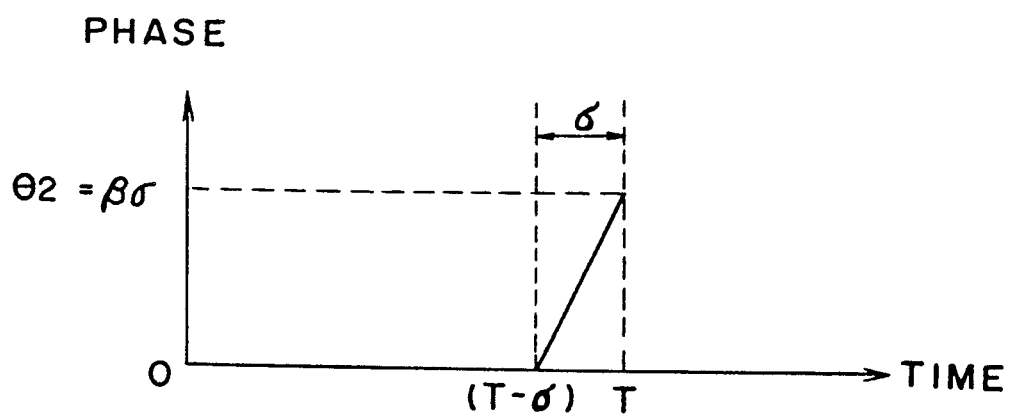
FIG. 4(b) is a characteristic curve showing the relationship between time and phase at point B in FIG. 1.

If the pulse generator 14 produces control pulses having a frequency 1/T and pulse duration $\sigma$, switch 7 is operated such that output A thereof is connected to the zero generator 13 during a pulse interval T-$\sigma$, and thereafter, the output A of the switch 7 is connected to adder 6 during the pulse duration $\sigma$. Thus, the output A of switch 7 produces a value $\beta$ during the pulse duration $\sigma$, and a value zero during the remaining period, as shown in FIG. 4(a). Thus, the signal at output B in FIG. 1 is such that the pulse is integrated during the pulse duration $\sigma$ by VCO 19, as shown in FIG. 4(b). Accordingly, the phase of the output B becomes $\theta_2 = \beta\sigma$.

Figure 3A:
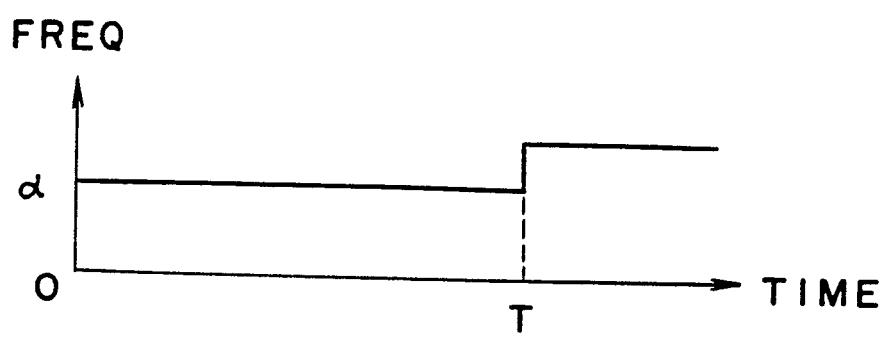
FIG. 3(a) is a graph showing the relationship between time and the frequency of the LPF output signal in an ideal digital phase locked loop having no in-loop delay.
Figure 3B:
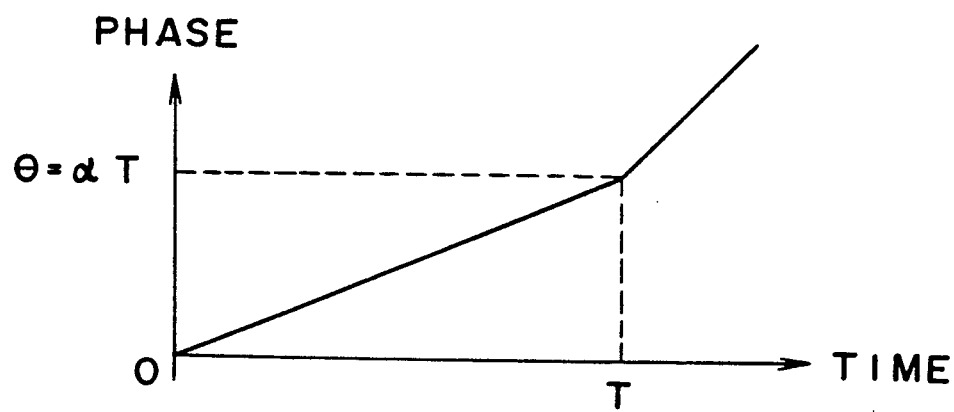
FIG. 3(b) is a graph showing the relationship between time and the phase of the VCO output signal.

If the output signal of the LPF in an ideal digital phase locked loop in which there is no in-loop delay has a value $\alpha$ for the period T as shown in FIG. 3(a), the value $\alpha$ is integrated by the VCO for the period T. In this case, the phase of the output signal after the period T becomes $\theta = \alpha T$, as shown in FIG. 3(b). Thus, in order to match the phases $\theta$ and $\theta_2$, the following equation:

$$\beta = \alpha T/\sigma$$

should be satisfied. To this end, coefficients of the first coefficient circuit 4 and the second coefficient circuit 5 are selected to have a value $\beta$ given by the above equation. It is understood that the in-loop delay has been corrected when $\theta = \theta_2$ is satisfied.

Referring to FIGS. 12(A)–12(D), the operation of the first embodiment according to the present invention during a period 0–3T is described under two different conditions: with no in-loop delay as in an ideal digital phase locked loop; and with in-loop delay.

Figure 12A:
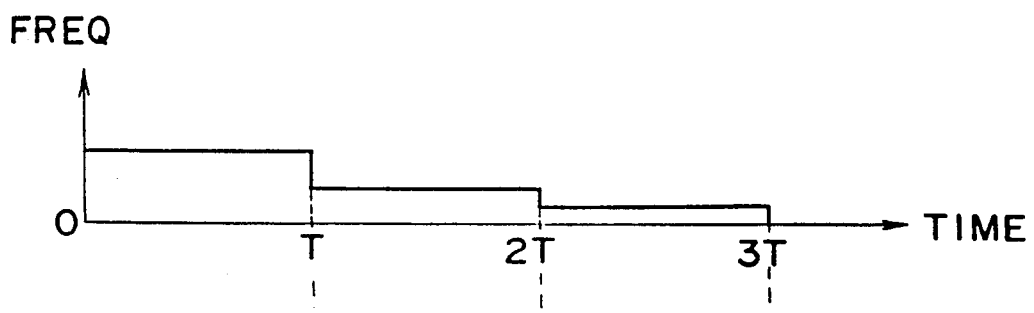
FIGS. 12(A)-12(D) show waveforms (A)-(D) in which the waveform of FIG. 12(A) is a characteristics diagram showing the relationship between the time and frequency of the LPF output signal in an ideal digital phase locked loop with no in-loop delay; the waveform of FIG. 12(B) is a characteristics diagram showing the relationship between the time and frequency of the LPF output signal in a digital phase locked loop with in-loop delay; the waveform of FIG. 12(C) is a characteristics diagram showing the relationship between the time and frequency at point A in FIG. 1, and the waveform of FIG. 12(D) is a characteristics diagram showing the relationship between the time and phase of the VCO output signal.
Figure 12B:
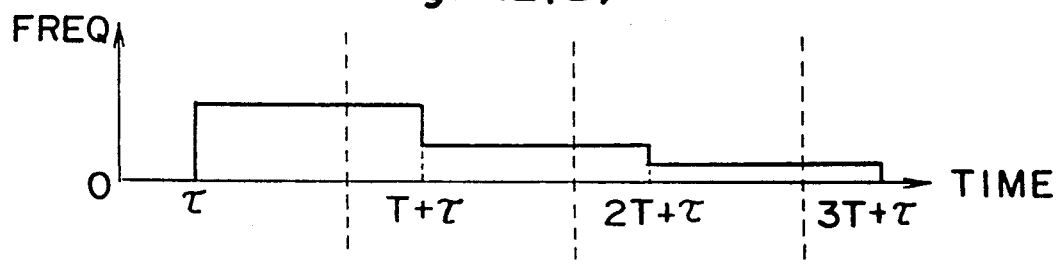
Figure 12C:
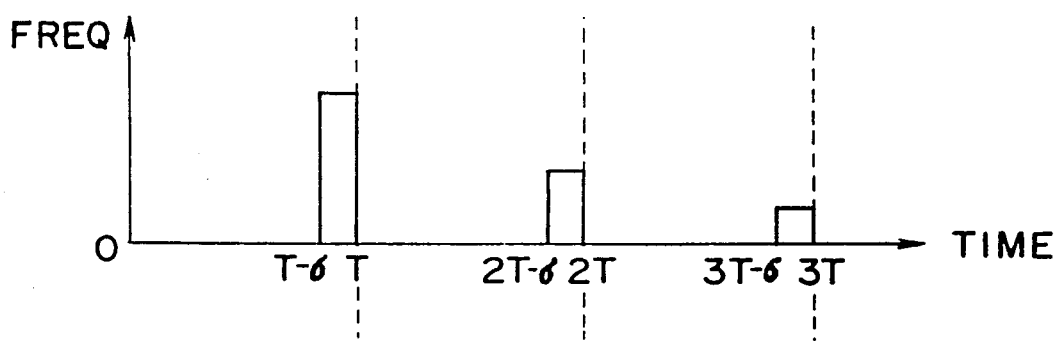

First, in an ideal digital phase locked loop in which there is no in-loop delay, the frequency of the output signal from LPF 18 varies as shown in FIG. 12(A). On the contrary, when there is in-loop delay, the frequency varying points are shifted by $\tau$ (referred to as in-loop delay) as shown in FIG. 12(B). Furthermore, in the case of the first embodiment, switch 7 is operated such that output A is connected to adder 6 during periods $T-\sigma \leq t \leq T$, $2T-\sigma \leq t \leq 2T$ and $3T-\sigma \leq t \leq 3T$, and to zero generator 13 during other periods, as shown in FIG. 12(C). Accordingly, the phase of the output of the VCO 19 would be as shown in FIG. 12(D), in which: the single dot-dash line corresponds to the phase difference in the case of frequency variation, indicated by FIG. 12(A), by the ideal digital phase locked loop with no in-loop delay; the double dot-dash line corresponds to the phase difference in the case of frequency variation, indicated by FIG. 12(B), by the conventional digital phase locked loop with in-loop delay; and the solid line corresponds to the phase difference in the case of frequency variation, indicated by FIG. 12(C), by the digital phase locked loop according to the first embodiment of the present invention.

Figure 12D:
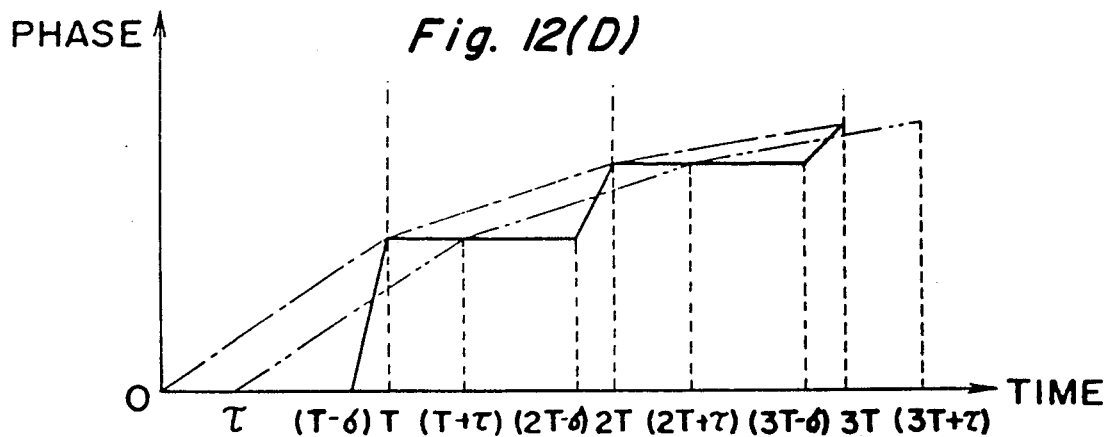

As apparent from FIG. 12(D), there is always a phase difference between the double dot-dash line (the line representing in-loop delay) and the single dot-dash line (the ideal state in which there is no in-loop delay). However, the solid line representing the first embodiment according to the present invention shows that the phase matches that of the ideal state of the single dot-dash line at each time point $t = T$, $2T$, and $3T$.

The description will be given in detail for the operation during a period $T \leq t \leq 2T + \tau$.

In the case where there is no switch 7 as in a conventional digital phase locked loop, i.e, the digital phase locked loop that results in double dot-dash line phase difference, one may attempt to correct the phase difference by changing the inclination of the double dot-dash line by appropriately changing the coefficient of the coefficient circuits in the LPF in a digital phase locked loop exhibiting in-loop delay so that the phase coincides with that of the single dot-dash line at $t = 2T$ and thus corrects the in-loop delay at that time point. However, because the VCO 19 continues to integrate even during $T \leq t \leq 2T + \tau$, the result is such that the signal phase is out of alignment at $t = 3T$ even if the phases are temporarily matched at $t = 2T$. In other words, it is necessary to use a switch 7 to change the output of the LPF 18 to 0 so that VCO 19 integration does not occur during the period $T \leq t \leq 2T + \tau$.

This problem can therefore be resolved, according to the present invention, by providing a switch 7 as described in the first embodiment to change the input to the VCO 19 to 0 (see FIG. 12(C)), during the period $T \leq t \leq 2T + \tau$ so that the output of the VCO 19 varies as illustrated by the solid line in FIG. 12(D).

It is also possible to select the time $\sigma$ (during which switch 7 is so switched to connect output A with zero generator 13) arbitrarily within $\tau \leq \sigma \leq T$. However, when the digital phase locked loop is operated as an automatic phase control (APC) with the use of color subcarrier signal in the standard television signal as the phase reference signal, and if the point at which the input to the VCO 19 changes is in the video signal period of the standard television signal, the color signal will appear as vertical lines when seen on the monitor. It is therefore appropriate to select the $\sigma$ to such an amount to set the varying point near the front porch immediately preceding the horizontal sync pulse.

As thus described, it is therefore possible to completely correct the in-loop delay in the digital phase locked loop circuit by providing: a phase comparator 1 which compares the phase of the input signal (phase reference signal) with the phase of the frequency divider 11 output at a constant period; a LPF 18 which filters and integrates the output from the phase comparator 1; a switch 7 which switches between the output of the LPF 18 and a constant value ("0"); a VCO 19 which oscillates at a frequency proportional to the output of the switch 7; and a frequency divider 11 which frequency divides the output of the VCO 19.

The LPF 18 is comprised of: an integrator 17 for integrating input signal; a first coefficient circuit 4 which amplifies the output of the integrator 17; a second coefficient circuit 5 which amplifies the input signal; and an adder 6 (the output of which becomes the output of the LPF 18) which adds the output of the first coefficient circuit 4 with the output of the second coefficient circuit 5).

An alternative embodiment according to the present invention is described herein below with reference to the accompanying drawings.

Figure 2:
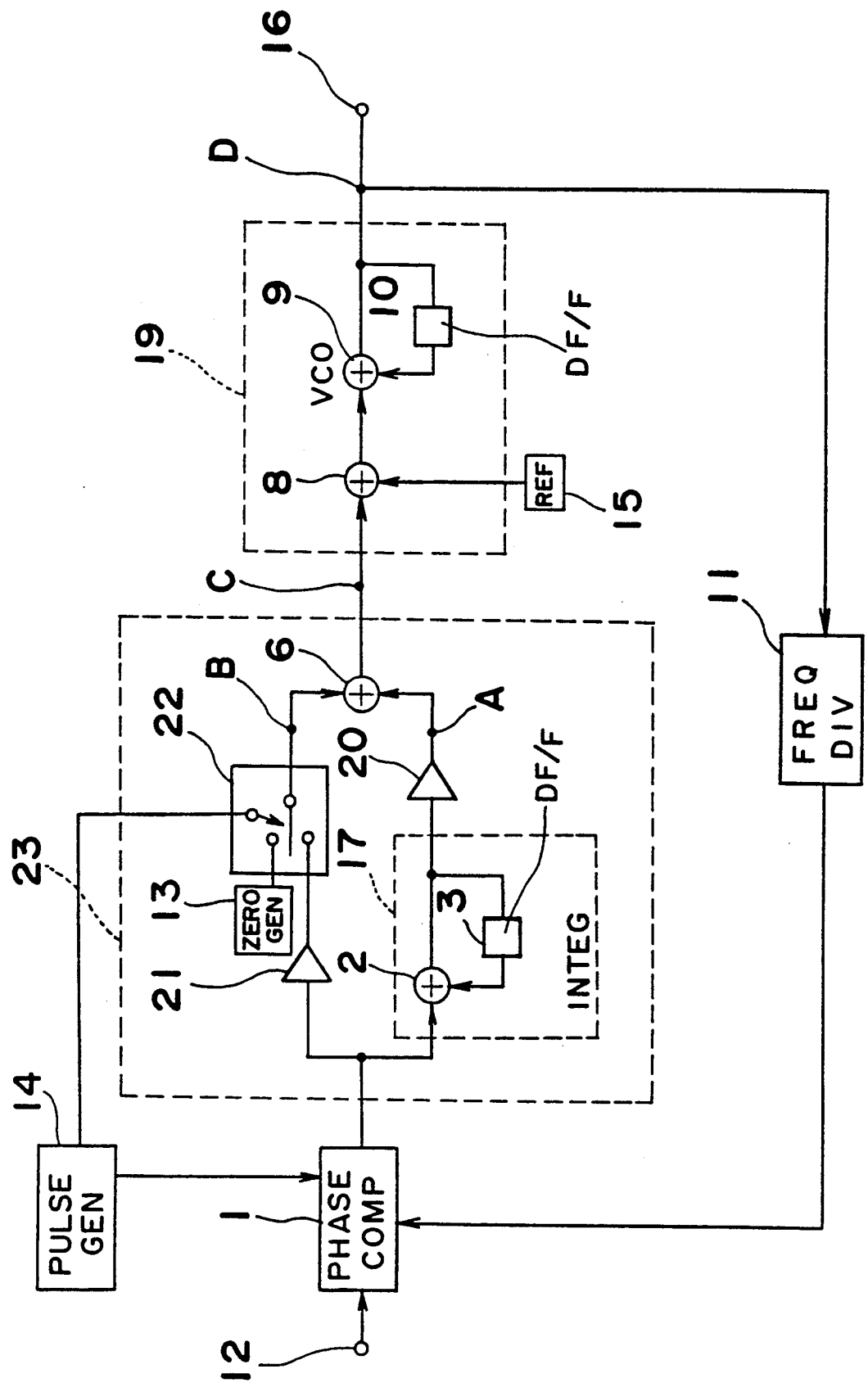
FIG. 2 is a block diagram of a digital phase locked loop circuit according to a second embodiment of the present invention.

Referring to FIG. 2, a digital phase locked loop according to a second embodiment of the present invention is shown. In FIGS. 1 and 2, like parts are identified by like numbers; those parts which differ are the coefficient circuits 20 and 21, the switch 22, and the LPF 23. The differences in connections are that the output of the coefficient circuit 21 is connected to one input of the switch 22, and the output of the switch 22 and the output of the coefficient circuit 20 are added by the adder 6.

The operation of a digital phase locked loop circuit thus comprised is described below with reference to FIG. 2 and FIGS. 5(a) to 5(f).

FIGS. 5(a), 5(c), and 5(e) show the relationship between time and frequency at points A, B, and C, respectively, in FIG. 2. FIG. 5(f) shows the relationship between time and phase at point D in FIG. 2. Note that FIG. 5(b) shows the relationship between time and phase at point D in FIG. 2 when only the signal at point A is integrated by VCO 19, and similarly, FIG. 5(d) shows the relationship between time and phase at point D in FIG. 2 when only the signal at point B is integrated by VCO 19.

As can be understood from FIGS. 5(a) and 5(b), the frequency signal at point A in FIG. 2 is the constant value $\gamma$ delayed by $\tau$ (the in-loop delay). If only this signal is integrated by the VCO 19, the phase $\theta_3$ after period T will be $\theta_3 = \gamma(T - \tau)$. Similarly, as can be seen from FIGS. 5(c) and 5(d), the frequency signal at point B is changed by the switch 22, during a period $\sigma$, to the output of the coefficient circuit 21. Thus, the amplitude during the period $\sigma$ is $\delta$, and 0 during the remaining period. If this signal only is integrated by the VCO 19, the phase $\theta_4$ after period T will be $\theta_4 = \delta\sigma$. Therefore, the final phase of the VCO 19 output is:

$$\theta_5 = \theta_3 + \theta_4 = \gamma(T - \tau) + \delta\sigma (\text{FIG. 5}(f)).$$

To resolve the phase delay problem, it is therefore sufficient to set the coefficient circuits 20 and 21 such that $\theta_5$ coincides with the ideal phase 8 (the phase in an ideal digital phase locked loop in which there is no in-loop delay).

Thus, by the employment of switch 22 (switch 7 in the first embodiment) the output of the coefficient circuit 21, determining the characteristics of the proportion component in the LPF 23 transfer function, is added intermittently to adder 6, whereas the output of the coefficient circuit 20, determining the characteristics of the integration component, is added always to adder 6. Therefore, when compared with the first embodiment, the VCO 19 according to the second embodiment can respond to the frequency signal (the output of the phase comparator 1) even if the output of the phase comparator 1 varies greater than $2\pi$ (rad) within the period T. In the second embodiment, because the frequency signal at point A cannot correct the in-loop delay $\tau$ as shown in FIG. 5(b), it is not possible to correct completely the in-loop delay of the digital phase locked loop as was possible in the first embodiment. However, because the response of the digital phase locked loop is highly dependent upon the proportion component (which is determined by the output of the coefficient circuit 21), there is virtually no deterioration of the response characteristics if this proportion component is corrected.

Therefore, according to the present invention, it is possible to obtain a phase-corrected output from a digital phase locked loop by providing: a phase comparator 1 which compares the phase of the input signal (phase reference signal) with the phase of the frequency divider 11 after every predetermined period; an LPF 23 which filters and integrates the output from the phase comparator 1; a VCO 19 which oscillates at a frequency proportional to the output of the LPF 23; and a frequency divider 11 which frequency divides the output of the VCO 19.

The LPF 23 according to the second embodiment is comprised of: an integrator 17 which integrates the input signal; a first coefficient circuit 20 which amplifies the output of the integrator 17, a second coefficient circuit 21 which amplifies the input signal; a switch 22 which changes the connection between the output of the second coefficient circuit 21 and a predetermined value, such as zero; and an adder 6 (the output of which becomes the output of the LPF 23) which adds the output of the switch 22 with the output of the first coefficient circuit 20.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A digital phase locked loop for correcting a phase of an output signal with respect to an input signal comprising:
    a variable frequency oscillating means;
    a phase comparator for comparing the phase of said input signal with the phase of an output signal from said variable frequency oscillating means after every predetermined period;
    an integrator for integrating the output of said phase comparator;
    a first coefficient circuit for amplifying the output of said integrator;
    a second coefficient circuit for amplifying the output of said phase comparator;
    a first adder for adding the output of the first coefficient circuit and the output of the second coefficient circuit;
    a predetermined level generator; and
    a switch for selecting between the output of said first adder and the output of said predetermined level generator and for supplying the selected output to said variable frequency oscillating means, whereby said variable frequency oscillating means oscillates at a frequency proportional to the output of said switch.

2. A digital phase locked loop for correcting a phase of an output signal with respect to an input signal comprising:
    a variable frequency oscillating means;
    a phase comparator for comparing the phase of said input signal with the phase of an output signal from said variable frequency oscillating means after every predetermined period;
    an integrator for integrating the output of said phase comparator;
    a first coefficient circuit for amplifying the output of said integrator;
    a second coefficient circuit for amplifying the output of said phase comparator;
    a predetermined level generator; and
    a switch for selecting between the output of said second coefficient circuit and the output of said predetermined level generator; and
    a first adder for adding the output of said switch and the output of said first coefficient circuit and for supplying the output of said first adder to said variable frequency oscillating means, whereby said variable frequency oscillating means oscillates at a frequency proportional to the output of said first adder.

3. The digital phase locked loop according to claim 1, wherein said variable frequency oscillating means comprises a variable frequency oscillator.

4. The digital phase locked loop according to claim 1, wherein said variable frequency oscillating means comprises a variable frequency oscillator and a frequency divider for frequency dividing the output of said variable frequency oscillator, whereby the phase of said input signal is compared with the phase of the output of said frequency divider by said phase comparator.

5. The digital phase locked loop according to claim 4, wherein said variable frequency oscillator comprises:
    a reference signal generator for generating a reference signal;
    a second adder for adding the output from said switch and said reference signal;
    a third adder;
    a first memory for temporarily storing an output of said third adder;
    wherein said third adder adds the output of said second adder and the output of said first memory.

6. The digital phase locked loop according to claim 1, wherein said integrator comprises:
    a fourth adder;
    a second memory for temporarily storing an output of said fourth adder;
    wherein said fourth adder adds the output of said phase comparator and the output of said second memory.

7. The digital phase locked loop according to claim 1, wherein said phase comparator comprises:
    a multiplier for multiplying said input signal by the output signal of said variable frequency oscillating means; and
    a low pass filter for integrating the output of said multiplier.

8. The digital phase locked loop according to claim 1, wherein said phase comparator comprises a flip-flop for latching and outputting the output signal of said variable frequency oscillating means, said flip-flop being latched in response to a specified edge of said input signal.

9. The digital phase locked loop according to claim 4, wherein said frequency divider comprises:
    an n-bit counter, where n is a natural number, for counting only the most significant bit of the output from said variable frequency oscillator when the number of bits in said input is m-bits, where m is a natural number; and a combining means for combining the output of said n-bit counter with said output from said variable frequency oscillator, whereby said frequency divider produces an (n+m) bit signal, where the signal of n-bits output from the n-bit counter is allocated as n-bits from the most significant bit of the output of the frequency divider, and the m-bit of the input is allocated as m-bits from the least significant bit of the output of the frequency divider.

10. The digital phase locked loop according to claim 9, wherein said frequency divider further comprises:

a read-only memory which receives said (n+m) bit signal and outputs data stored at an address specified by the (n+m) bit signal.

11. The digital phase locked loop according to claim 2, wherein said variable frequency oscillating means comprises a variable frequency oscillator and a frequency divider for frequency dividing the output of said variable frequency oscillator, whereby the phase of said input signal is compared with the phase of the output of said frequency divider by said phase comparator.

12. The digital phase locked loop according to claim 11, wherein said variable frequency oscillator comprises:

a reference signal generator for generating a reference signal;

a second adder for adding the output from said first adder and said reference signal;

a third adder;

a first memory for temporarily storing an output of said third adder;

wherein said third adder adds the output of said second adder and the output of said first memory.

13. The digital phase locked loop according to claim 2, wherein said integrator comprises:

a fourth adder;

a second memory for temporarily storing an output of said fourth adder;

wherein said fourth adder adds the output of said phase comparator and the output of said second memory.

14. The digital phase locked loop according to claim 2, wherein said phase comparator comprises:

a multiplier for multiplying said input signal by the output signal of said variable frequency oscillating means; and a low pass filter for integrating the output of said multiplier.

15. The digital phase locked loop according to claim 2, wherein said phase comparator comprises a flip-flop for latching and outputting the output signal of said variable frequency oscillating means, said flip-flop being latched in response to a specified edge of said input signal.

16. The digital phase locked loop according to claim 11, wherein said frequency divider comprises:

an n-bit counter, where n is a natural number, for counting only the most significant bit of the output from said variable frequency oscillator when the number of bits in said input is m-bits, where m is a natural number; and a combining means for combining the output of said n-bit counter with said output from said variable frequency oscillator, whereby said frequency divider produces an (n+m) bit signal, where the signal of n-bits output from the n-bit counter is allocated as n-bits from the most significant bit of the output of the frequency divider, and the m-bit of the input is allocated as m-bits from the least significant bit of the output of the frequency divider.

17. The digital phase locked loop according to claim 16, wherein said frequency divider further comprises:

a read-only memory which receives said (n+m) bit signal and outputs data stored at an address specified by the (n+m) bit signal.

18. The digital phase locked loop according to claim 1, wherein said first and second coefficient circuits carry first and second predetermined coefficients.

19. The digital phase locked loop according to claim 18, wherein said first and second predetermined coefficients are so selected that the output of said first adder satisfies the following equation:

$$\beta = \alpha T / \sigma$$

wherein $\beta$ is the output of said first adder, $\alpha$ is an ideal output of said first adder when there is no in-loop delay in the digital phase locked loop, T is a one cycle period in which the phase of said input signal and the phase of the output signal of said variable frequency oscillating means are phase compared by said phase comparator, and $\sigma$ is a duration, within said period T, in which said switch is connected to said predetermined level generator.

20. A digital phase locked loop for correcting a phase of an output signal with respect to an input signal comprising:

a variable frequency oscillating means;

a phase comparator for comparing the phase of said input signal with the phase of an output signal from said variable frequency oscillating means after every predetermined period;

a low pass filter for integrating an output of said phase comparator;

a predetermined level generator; and a switch for alternately selecting between the output of said low pass filter and the output of said predetermined level generator and for applying the selected output to said variable frequency oscillating means, whereby said variable frequency oscillating means oscillates at a frequency proportional to the output of said switch.

* * * * *